US008535796B2

(12) United States Patent  
Becker-Willinger et al.

(10) Patent No.: US 8,535,796 B2  
(45) Date of Patent: Sep. 17, 2013

(54) COMPOSITE COMPOSITION FOR MICROPATTERNED LAYERS HAVING HIGH RELAXATION ABILITY, HIGH CHEMICAL RESISTANCE AND MECHANICAL STABILITY

(75) Inventors: Carsten Becker-Willinger, Saarbruecken (DE); Pamela Kalmes, Merchweiler (DE); Helmut Schmidt, Saarbruecken-Guedingen (DE); Etsuko Hino, Tokyo (JP); Mitsutoshi Noguchi, Tokyo (JP); Yoshikazu Saito, Tokyo (JP); Norio Ohkuma, Tokyo (JP)

(73) Assignees: Leibniz-Institut fuer Neue Materialien Gemeinnuetzige GmbH, Saarbruecken (DE); Canon Kabushiki Kaisha, Tokyo (JP)

( * ) Notice: Subject to any disclaimer, the term of this patent is extended or adjusted under 35 U.S.C. 154(b) by 822 days.

(21) Appl. No.: 11/794,742

(22) PCT Filed: Jan. 20, 2006

(86) PCT No.: PCT/EP2006/000510  
§ 371 (c)(1),  
(2), (4) Date: Feb. 4, 2008

(87) PCT Pub. No.: WO2006/077140  
PCT Pub. Date: Jul. 27, 2006

(65) Prior Publication Data  
US 2008/0213547 A1 Sep. 4, 2008

(30) Foreign Application Priority Data

Jan. 21, 2005 (DE) .......................... 10 2005 002 960

(51) Int. Cl.  
*B32B 3/10* (2006.01)  
*B32B 27/38* (2006.01)  
*B05D 5/00* (2006.01)  
*B05D 3/00* (2006.01)  
*B05D 3/02* (2006.01)  
*C09D 163/00* (2006.01)  
*C09D 183/04* (2006.01)  
*C08L 63/00* (2006.01)  
*C08L 83/04* (2006.01)

(52) U.S. Cl.  
USPC ........... 428/339; 428/413; 428/417; 428/418; 428/447; 428/450; 427/271; 427/336; 427/386; 427/387; 523/427; 523/433; 523/456

(58) Field of Classification Search  
None  
See application file for complete search history.

(56) References Cited

U.S. PATENT DOCUMENTS

| | | | |
|---|---|---|---|
| 4,994,299 A | 2/1991 | Stein et al. | |
| 5,057,550 A | 10/1991 | Lutz et al. | |
| 5,178,959 A | 1/1993 | Eckberg et al. | |
| 5,217,805 A | 6/1993 | Kessel et al. | |
| 5,260,348 A | 11/1993 | Shepherd et al. | |
| 5,359,017 A * | 10/1994 | Hamazu et al. | ................ 526/211 |
| 5,411,996 A | 5/1995 | Eckberg et al. | |
| 5,457,003 A * | 10/1995 | Tanaka et al. | ................ 430/176 |
| 5,516,858 A | 5/1996 | Morita et al. | |
| 5,644,014 A | 7/1997 | Schmidt et al. | |
| 5,656,336 A | 8/1997 | Kamen et al. | |
| 5,674,964 A | 10/1997 | Wolter et al. | |
| 5,721,015 A | 2/1998 | Iwamura et al. | |
| 5,910,522 A | 6/1999 | Schmidt et al. | |
| 5,952,439 A | 9/1999 | Morita et al. | |
| 5,973,176 A | 10/1999 | Roscher et al. | |
| 6,121,339 A | 9/2000 | Kominami et al. | |
| 6,183,567 B1 | 2/2001 | Kamijo et al. | |
| 6,248,854 B1 | 6/2001 | Hohn et al. | |
| 6,358,612 B1 | 3/2002 | Bier et al. | |
| 6,391,999 B1 * | 5/2002 | Crivello | .......................... 528/12 |
| 6,423,378 B1 | 7/2002 | Cotting et al. | |
| 6,455,112 B1 | 9/2002 | Ohkuma et al. | |
| 6,476,174 B1 | 11/2002 | Lee et al. | |
| 6,511,753 B1 | 1/2003 | Teranishi et al. | |
| 6,632,897 B1 | 10/2003 | Geiter et al. | |
| 6,723,440 B2 | 4/2004 | Valeri et al. | |
| 6,743,510 B2 | 6/2004 | Ochiai | |
| 6,911,235 B2 | 6/2005 | Frances et al. | |
| 7,985,477 B2 | 7/2011 | Schmidt et al. | |

(Continued)

FOREIGN PATENT DOCUMENTS

| | | |
|---|---|---|
| CN | 1218437 | 6/1999 |
| CN | 1226263 A | 8/1999 |

(Continued)

OTHER PUBLICATIONS

Office Action for Japanese Patent Application No. 2005-507495, Mailed on Jul. 28, 2010.  
Japanese Intellectual Property Office, Office Action for Japanese patent application No. 2005-507495 issued Nov. 18, 2009.  
English translation of Japanese Intellectual Property Office, Office Action for Japanese patent application No. 2005-507495 issued Nov. 18, 2009 (citing Japanese Patent Publication No. 2000-212433).  
Japanese Intellectual Property Office, Office Action for Japanese patent application No. 2005-507496 issued Nov. 18, 2009.  
English translation of Japanese Intellectual Property Office, Office Action for Japanese patent application No. 2005-507496 issued Nov. 18, 2009 (citing Japanese Patent Publication No. 2000-212433).

(Continued)

*Primary Examiner* — Michael J Feely  
(74) *Attorney, Agent, or Firm* — Cahn & Samuels, LLP

(57) ABSTRACT

A polymerizable composite composition comprising a) a hydrolysate and/or condensate of at least one hydrolysable alkylsilane having at least one alkyl group, at least one hydrolysable arylsilane having at least one aryl group or at least one hydrolysable alkylarylsilane having at least one alkylaryl group, and at least one hydrolysable silane containing an epoxy group, b) at least one organic compound having at least 2 epoxy groups, and c) a cationic initiator, is suitable to provide, upon curing, substrates with a patterned coating or patterned molded articles. The patterned coatings and molded articles obtained show high relaxation ability, high chemical resistance and mechanical stability. Micropatterns can be obtained with high stability of shape.

29 Claims, No Drawings

(56) References Cited

U.S. PATENT DOCUMENTS

| | | | |
|---|---|---|---|
| 8,017,211 | B2 | 9/2011 | Terauchi |
| 2002/0001016 | A1 | 1/2002 | Aono et al. |
| 2003/0169313 | A1 | 9/2003 | Shimomura et al. |
| 2003/0175411 | A1 | 9/2003 | Kodas et al. |
| 2003/0211338 | A1 | 11/2003 | Frances et al. |
| 2003/0224286 | A1 | 12/2003 | Barclay et al. |
| 2004/0001961 | A1* | 1/2004 | Ono et al. .............. 428/500 |
| 2005/0131106 | A1 | 6/2005 | Tonapi et al. |
| 2006/0132539 | A1 | 6/2006 | Hino et al. |
| 2006/0135723 | A1* | 6/2006 | Nakayama ............. 528/10 |
| 2006/0153993 | A1 | 7/2006 | Schmidt et al. |
| 2006/0154091 | A1 | 7/2006 | Schmidt et al. |
| 2008/0032061 | A1 | 2/2008 | Watanabe et al. |
| 2008/0103254 | A1 | 5/2008 | Asada |
| 2010/0129587 | A1 | 5/2010 | Terauchi |

FOREIGN PATENT DOCUMENTS

| | | | |
|---|---|---|---|
| CN | 1416447 | | 5/2003 |
| CN | 1432601 | A | 7/2003 |
| DE | 10323729 | A1 | 12/2004 |
| DE | 102005002960 | A1 | 8/2006 |
| EP | 0 431 809 | B1 | 6/1991 |
| EP | 0466025 | A2 | 1/1992 |
| EP | 5 262 961 | A | 10/1993 |
| EP | 0 567 969 | A1 | 11/1993 |
| EP | 0 965 618 | B1 | 12/1999 |
| EP | 1 045 290 | A2 | 10/2000 |
| EP | 1 215 254 | A2 | 6/2002 |
| EP | 1 120 448 | B1 | 1/2003 |
| JP | 61261365 | A | 11/1986 |
| JP | 63048363 | A | 3/1988 |
| JP | 03293067 | A | 12/1991 |
| JP | 04338958 | A | 11/1992 |
| JP | 06298897 | A | 10/1994 |
| JP | 08266994 | A | 10/1996 |
| JP | 2000212443 | A | 8/2000 |
| JP | 2000347001 | A | 12/2000 |
| JP | 2002298648 | A | 10/2002 |
| JP | 2003262716 | A | 9/2003 |
| JP | 2004010849 | A | 1/2004 |
| JP | 2004012810 | A | 1/2004 |
| JP | 2004155454 | | 6/2004 |
| JP | 2004155954 | | 6/2004 |
| JP | 2005004052 | A | 1/2005 |
| JP | 2005015581 | A | 1/2005 |
| JP | 2005089697 | A | 4/2005 |
| JP | 2005336421 | A | 8/2005 |
| JP | 2006045523 | A | 2/2006 |
| JP | 2006070152 | A | 3/2006 |
| JP | 2008133442 | A | 6/2008 |
| KR | 20030040065 | | 5/2003 |
| TW | 047282 | | 11/1982 |
| TW | 149535 | B | 1/1991 |
| TW | 482817 | B | 4/2002 |
| TW | 528784 | B | 4/2003 |
| WO | WO/97/32732 | | 12/1997 |
| WO | WO98/51747 | A1 | 11/1998 |
| WO | WO 99/63022 | A1 | 12/1999 |
| WO | WO 01/53385 | A1 | 7/2001 |
| WO | WO 2004072150 | A1 * | 8/2004 |
| WO | WO 2005/014742 | A1 | 2/2005 |
| WO | WO 2005/014745 | A1 | 2/2005 |
| WO | 2006059702 | A1 | 6/2006 |
| WO | WO 2006/077140 | A1 | 7/2006 |
| WO | WO 2008/009608 | | 1/2008 |

OTHER PUBLICATIONS

Office Action for Taiwanese Patent Application No. 93121966 dated Feb. 23, 2011.
English abstract of CN1226263.
English abstract of TW528784.
English abstract of CN 1218437.
English abstract of CN 1416447.
English abstract of KR 20030040065.
Abstract of JP 2005 004052 A.
Abstract of DE10323729.
Abstract of JP2005015581.
Abstract of JP2005089697.
Abstract of JP2000347001.
Abstract of DE102005002960.
English Abstract of JP2004010849 A.
English Abstract of JP06298897 A.
English Abstract of JP04338958 A.
English Abstract of JP2004012810 A.
English Abstract of JP2003262716 A.
English Abstract of JP2005336421 A.
English Abstract of JP 2008133442 A.
Japanese Office Action for Application No. 2007-551622 mailed on Jun. 28, 2011.
Japanese Application No. 2005-507496, Decision to Decline the Amendment, dated May 31, 2011.
Japanese Application No. 2005-507496, Decision of Final Rejection, dated May 31, 2011.
Abstract of Jiguet, S., et al., "Conductive SU8-silver Composite Photopolymer," 17th IEEE International Conference on Micro Electro Mechancial Systems, Technical Digest, Jan. 25-29, 2004.
English Abstract of JP 2005004052A.
English Abstract of JP 2002298648A.
English Abstract of JP 2006070152A.
English Abstract of JP 2006045523A.
English Abstract of JP 61261365A.
Japanese Office Action for Application No. 2009-519938 mailed on Oct. 18, 2011.
Taiwanese Decision of Rejection for Application No. 093121966 dated Sep. 28, 2011.
English Abstract of WO 2006059702.
Office Action for Japanese Patent Application No. 2005-507496, Mailed on Jul. 28, 2010.
Office Action for Japanese Patent Application No. 093121967.
English Abstract of JP 63048363.
English Abstract of WO 99/63022.
English Abstract of JP 08266994.
Machine translation of JP 08266994.
English Abstract of JP 03293067.
English Abstract of CN 1432601.
English Abstract of TW 482817.
English Abstract of JP 2000212443.
Daicel Chemical Industries, Ltd., Data Sheet: EHPE 3150, http://www.daicel.co.jp/kinouhin/english/syousai/ehpe_3150.html, printed on Jul. 29, 2009.
Abstract of JP 2004 155954 A.

* cited by examiner

COMPOSITE COMPOSITION FOR MICROPATTERNED LAYERS HAVING HIGH RELAXATION ABILITY, HIGH CHEMICAL RESISTANCE AND MECHANICAL STABILITY

This application is a 371 U.S. national stage application of international application PCT/EP2006/000510 filed Jan. 20, 2006, which claims priority of German patent application 10 2005 002 960.4 filed Jan. 21, 2005, the disclosure of which is herein incorporated by reference in its entirety.

The present invention relates to a composite composition based on organic and inorganic components which contain epoxy groups, to patterned moulded articles and substrates having a patterned coating obtained from this composite composition, and to a method of preparing such substrates and moulded articles. The patterns can comprise micropatterns.

Sol-gel derived inorganic materials typically have a high temperature resistance, a high chemical resistance and a high mechanical stability. One of the drawbacks is the need of using high temperatures during processing to obtain completely dense systems. So-called hybrid materials or inorganic-organic molecular composites may overcome these disadvantages in part, but still suffer from the lack of high relaxation ability due to the network which still has a high degree of three-dimensional cross-linking. Accordingly, this type of material may cause serious problems, if stress-free films or coatings have to be fabricated. Particularly, the use of this type of material is extremely difficult for applications where stresses are completely unsuitable, such as in optics or microelectronics, especially sensitive optics or microelectronics.

The literature describes many hybrid materials, but all of them are characterised by three-dimensionally cross-linked backbones which show the above described problems. There have been many attempts to overcome these problems by adding organic polymers to these materials. In this manner, the relaxation behaviour can be improved, but at the expense of mechanical stability and reduced resistance to organic solvents. This results in swelling or even in dissolution of the polymer components in the organic solvent, and the desired mechanical stability that is especially important for maintaining the shape after micropatterning cannot be achieved.

If micropatternable systems are involved, the requirements regarding shape stability, chemical resistance, relaxation, and material design become much more complex because most of the organic monomers used for photopatterning processes have properties inadequate for the above mentioned requirements.

Thus, the object of the invention was to provide a film-forming system for the preparation of micropatterns, for example by photolithography, having a sufficient relaxation behaviour to avoid high residual stresses in a pattern system and, at the same time, being chemically resistant and having a high stability of shape. Furthermore, the system should be suitable for the preparation of corresponding patterned moulded articles.

Surprisingly, this object has been achieved by a composite composition comprising a) a hydrolysate and/or condensate of a1) at least one hydrolysable alkylsilane having at least one alkyl group, preferably wherein at least one alkyl group contains at least 3 carbon atoms, a2) at least one hydrolysable arylsilane having at least one aryl group or at least one hydrolysable alkylarylsilane having at least one alkylaryl group, and a3) at least one hydrolysable silane containing an epoxy group, b) at least one organic compound having at least 2 epoxy groups, and c) a cationic initiator.

Using this composite composition, a patterned layer having outstanding properties can be obtained. Thus, the present invention also provides a substrate having a patterned coating or a patterned moulded article obtainable by A) applying said composite composition to a substrate or placing it in a mould, C) patternwise irradiating the formed layer of the composite composition for partial curing, D) subjecting the coating to a heat treatment for further curing, and E) developing the coating by treating it with a solvent.

The layers on the substrates and the moulded articles obtained are substantially or completely stress-free and show a remarkable stability of shape, particularly for micropatterns. Further, the systems obtained show an excellent resistance to chemical attack, even by alkaline media.

Without wishing to be bound to any theory, it is believed that the excellent properties of the systems of the invention result at least in part from the complex interaction of the components involved. The combination of silanes containing epoxy groups, hereinafter also referred to as epoxysilanes, and organic multifunctional epoxides can be linked together in a polycondensation reaction initiated by photoinitiators. This reaction is also the basis for the application of photolithographic processing. However, this combination alone shows strong shrinkage during reaction leading to high residual stresses. Unexpectedly, this could be overcome by the additional use of alkylsilanes, preferably monoalkylsilanes and/or dialkylsilanes, and arylsilanes or alkylarylsilanes. It is believed that the reduction of stress achieved in the layers by generating an improved relaxation behaviour is mainly caused by the alkylsilanes. In fact, the use of such alkylsilanes having a longer alkyl chain such as e.g. a hexyl group leads to completely stress-free films. Therefore, alkylsilanes having at least one alkyl group having 3 or more carbon atoms are preferably used. The same behaviour can be observed with alkylsilanes having 2 alkyl groups (dialkylsilanes) which form linear structures with less cross-linking density. On the other hand, the arylsilanes or alkylarylsilanes appear to contribute significantly to the observed good stability of shape of the micropatterns developed by pattern forming processes such as photolithography.

With regard to the good photopatterning behaviour, the active species of the cationic photopolymerisation reaction of the epoxy groups remain active for some time also after the irradiation and the activity of these species is further promoted during a thermal post-treatment step (e.g. several minutes at 90° C.) such that the cationically polymerised epoxy groups are converted to high molecular weight polyether structural units. By the three-dimensional cross-linking of the organic polyether units generated with the pre-condensed inorganic network via epoxy silanes a highly cross-linked structure with a sufficiently high glass transition temperature is formed which shows a high resistance against organic developing solvents such as ketones and which does not flow during the thermal post-treatment (stability of shape) at high temperatures such as for example up to 200° C. The arylsilane or alkylarylsilane in the inorganic network portion, on the other hand, improves the solubility of the non-polymerized areas such that the development step is even possible with solvents of lower dissolving power than e.g. ketones such as e.g. alcohols.

The high relaxation ability of the materials obtained from the composite composition according to the present invention is apparently due to the alkylsilanes preferably carrying longer alkyl chains of at least 3 carbon atoms such as hexyl. These are believed to introduce a bulky side group into the network slightly reducing the network connectivity and at the same time increasing the segmental movement ability of the network chains (internal flexibilizer) leading to reduced internal stress in the material. Also, alkylsilanes having 2 alkyl groups, e.g. dialkyldialkoxysilanes, reduce the network density and form linear structural units with higher flexibility. This improvement may be also achieved to a high degree if the dialkylsilanes used do not contain alkyl groups having 3 or more C atoms. Even methyl groups may be appropriate, e.g. dimethyldialkoxysilane.

Furthermore, the high molecular weight organic polyether structures formed in the photopolymerisation reaction of the epoxy functions show high hydrolytic stability (in contrast to e.g. polymethacrylate structures) and protect the silane network against hydrolytic attack from basic media leading to an advantageous combination of both the organic and the inorganic structural units.

Thus, micropatterned layers having a high relaxation ability and a high chemical resistance and mechanical stability can be obtained. The patterning process is preferably a photopatterning process such as photolithography.

The cured composite composition comprises a siloxane framework (inorganic framework) formed from the hydrolysable silanes and an organic framework formed by the multifunctional compound having epoxy groups, which are linked by ether bonds. In this manner, the cured composite composition will be a hybrid material wherein organic and inorganic components are combined. In the following, the present invention will be described in more detail.

The composite composition of the invention comprises a hydrolysis and/or condensation product of a1) at least one hydrolysable alkylsilane having at least one alkyl group, wherein preferably at least one alkyl group contains at least 3 carbon atoms, a2) at least one hydrolysable arylsilane having at least one aryl group or at least one hydrolysable alkylarylsilane having at least one alkylaryl group, and a3) at least one hydrolysable silane containing an epoxy group. Hydrolysable silanes comprise at least one hydrolysable substituent.

The hydrolysable alkylsilane comprises at least one alkyl group that is directly attached to the Si atom. Said alkyl group directly attached to Si is a non-hydrolysable group as is generally known. The alkyl group may be linear or branched. The alkyl group may have substituents such as chlorine, though an unsubstituted alkyl is more preferred. The alkyl group is generally $C_1$-$C_{30}$ alkyl, preferably $C_3$-$C_{20}$ alkyl, and more preferably $C_5$-$C_{12}$ alkyl. A hexyl group is particularly preferred. The alkylsilane may contain further alkyl groups directly attached to Si. The hydrolysable groups are those generally used and well-known to the persons skilled in the art.

The hydrolysable alkylsilane is preferably selected from compounds represented by the general formula (I)

$$R_a SiX_{(4-a)} \quad (I)$$

wherein R, which may be the same or different, is an alkyl substituent, at least one of which preferably has at least 3 carbon atoms, X is a hydrolysable substituent, and a is an integer of from 1 to 3. n is preferably 1 or 2, and more preferably 1. The alkylsilane having at least one alkyl group having at least 3 carbon atoms is preferably a monoalkylsilane.

In general formula (I) the hydrolysable substituents X, which may be identical or different from one another, are, for example, hydrogen or halogen (F, Cl, Br or I), alkoxy (preferably $C_{1-6}$ alkoxy, such as methoxy, ethoxy, n-propoxy, isopropoxy and n-butoxy, sec-butoxy, isobutoxy, and tert-butoxy), aryloxy (preferably $C_{6-10}$ aryloxy, such as phenoxy), acyloxy (preferably $C_{1-6}$ acyloxy, such as acetoxy or proplonyloxy), alkylcarbonyl (preferably $C_{2-7}$ alkycarbonyl, such as acetyl), amino, monoalkylamino or dialkylamino having preferably from 1 to 12, in particular from 1 to 6, carbon atoms. Preferred hydrolysable radicals are halogen, alkoxy groups, and acyloxy groups. Particularly preferred hydrolysable radicals are $C_{1-4}$ alkoxy groups, especially methoxy and ethoxy.

The non-hydrolysable substituent R, which may be identical to or different from one another, is an alkyl group, typically selected from $C_1$-$C_{30}$ alkyl. At least one of the R groups is preferably selected from $C_3$-$C_{20}$ alkyl, more preferably $C_5$-$C_{12}$ alkyl. A hexyl group is most preferred. The alkyl group may be linear or branched. Examples are methyl, ethyl, n-propyl, isopropyl, n-butyl, s-butyl and t-butyl, as well as linear or branched pentyl, hexyl, heptyl, octyl, nonyl, decyl, dodecyl, hexadecyl. An example for a higher branched alkyl is 2-ethylhexyl. The alkyl groups include also cycloalkyl such as cyclopropyl, cyclopentyl or cyclohexyl. Though radicals R may contain one or more substituents such as halogen, this is not preferred.

Specific, non-limiting examples of said hydrolysable alkylsilanes are methyl-trimethoxysilane, methyltriethoxysilane, methyltripropoxysilane, ethyltrimethoxy-silane, ethyltriethoxysilane, ethyltripropoxysilane, propyltrimethoxysilane, propyl-triethoxysilane, propyltripropoxy-silane, dimethyldiethoxysilane, dimethyldimethoxy-silane, n-butyltrimethoxysilane, n-butyltriethoxysilane, t-butyltrimethoxysilane, t-butyltriethoxysilane, hexyltrimethoxysilane, hexyltriethoxysilane, decyltrimethoxy-silane, and decyltriethoxysilane.

The hydrolysable arylsilanes or alkylarylsilanes comprise at least one aryl or alkylaryl group that is directly attached to the Si atom. Said groups directly attached to Si are non-hydrolysable groups as is generally known. The aryl or alkylaryl groups may be substituted or unsubstituted and are non-polymerizable groups. Substituents may be halogen, such as chlorine or bromine, and alkyl, for example those mentioned above.

Hence, aryl includes also arylalkyl. A preferred aryl group is substituted or unsubstituted phenyl. The hydrolysable arylsilane or alkylarylsilane may also contain other non-hydrolysable groups such as the alkyl groups mentioned above.

The hydrolysable arylsilane or alkylarylsilane is preferably selected from compounds represented by the general formula (II)

$$R'_a SiX_{(4-a)} \quad (II)$$

wherein R', which may be the same or different, is a non-hydrolysable substituent selected from alkyl, aryl, and alkylaryl, at least one of which is an aryl or alkylaryl group, X is a hydrolysable substituent, and a is an integer from 1 to 3, preferably 1 or 2.

Group X has the same meaning as in general formula (I). If an alkyl is contained as a non-hydrolysable radical R', reference can be made to the definitions of general formula (I) for suitable alkyl groups. Examples of aryl or alkylaryl groups R' are substituted and unsubstituted phenyl, naphthyl, benzyl and tolyl. R' may contain one or more substituents, such as halogen, alkyl, and alkoxy. R' may contain for example 6 to 20 carbon atoms.

Specific, non-limiting examples of said hydrolysable arylsilanes or alkylarylsilanes are phenyltrimethoxysilane, phenyltriethoxysilane, phenyltripropoxysilane, diphenyldimethoxysilane, and diphenyldiethoxysilane.

The hydrolysable silane containing an epoxy group, also called epoxysilane, comprises at least one hydrolysable substituent and at least one non-hydrolysable substituent containing at least one epoxy group. The epoxy group is a cationically polymerizable group which can be polymerised or crosslinked by a cationic initiator. Epoxy groups include glycidyl and glycidyloxy groups.

A preferred hydrolysable silane having an epoxy group is a compound of general formula (III):

$$RcSi(R)_bX_{(3-b)} \quad (III)$$

wherein Rc is a non-hydrolysable substituent having a epoxy group, R is a non-hydrolysable substituent, X is a hydrolysable substituent, and b is an integer of from 0 to 2, preferably 0. The groups X are as defined in general formula (I) and formula (II) above. R may be an alkyl, aryl or alkylaryl group as defined for R in formula (I) or for R' in formula (II).

The non-hydrolysable substituent Rc comprises at least and preferably only one epoxide group (e.g. glycidyl or glycidyloxy group), which is attached to the silicon atom by way of a divalent organic group, such as alkylene, including cycloalkylene, and alkenylene bridge groups, which may be interrupted by oxygen or —NH— groups. The bridge may contain one or more conventional substituents such as halogen or alkoxy. The bridge is preferably $C_{1-20}$ alkylene, more preferably a $C_{1-6}$ alkylene, which may be substituted, for example, methylene, ethylene, propylene or butylene, especially propylene, or cyclohexylalkyl, especially cyclohexylethyl.

Specific examples of said substituent Rc are glycidyl or glycidyloxy $C_{1-20}$ alkyl, such as γ-glycidylpropyl, β-glycidyloxyethyl, γ-glycidyloxypropyl, δ-glycidyloxybutyl, ε-glycidyloxypentyl, ω-glycidyloxyhexyl, and 2-(3,4-epoxycyclohexyl)ethyl. The most preferred substituents Rc are glycidyloxypropyl and epoxycyclohexylethyl.

Specific examples of corresponding silanes are γ-glycidoxypropyltrimethoxysilane (GPTS), γ-glycidoxypropyltriethoxysilane (GPTES), glycidyloxypropylmethyldialkoxysilane and glycidyloxypropyldimethylmonoalkoxysilane, wherein alkoxy is methoxy or ethoxy, epoxycyclohexylethyltrimethoxysilane, and epoxycyclohexylethyltriethoxysilane. However, the invention is not limited to the above-mentioned compounds.

Generally, the hydrolysate and/or condensate is a hydrolysis and/or condensation product of the above-mentioned hydrolysable silanes prepared by hydrolysis and condensation of said starting compounds in accordance with the sol-gel method, which is known to those skilled in the art. The sol-gel method generally comprises the hydrolysis of said hydrolysable silanes, optionally aided by acid or basic catalysis. The hydrolysed species will typically condense partially. The hydrolysis and condensation reactions cause the formation of condensation products having e.g. hydroxy groups and/or oxo bridges. The hydrolysis/condensation product may be controlled by appropriately adjusting parameters, such as e.g. the water content for hydrolysis, temperature, period of time, pH value, solvent type, and solvent amount, in order to obtain the condensation degree and viscosity desired.

Moreover, it is also possible to add a metal alkoxide in order to catalyse the hydrolysis and to control the degree of condensation. For said metal alkoxide, those hydrolysable metal compounds defined below may be used, especially an aluminum alkoxide, a titanium alkoxide, a zirconium alkoxide, and corresponding complex compounds (e.g. with acetyl acetone as the complex ligand) are appropriate.

In the sol-gel process, a solvent may be used. However, it is also possible to conduct the sol-gel process without a solvent. Usual solvents may be used, e.g. water, alcohols such as aliphatic $C_1$-$C_8$ alcohols, e.g. methanol, ethanol, 1-propanol, isopropanol and n-butanol, ketones, such as $C_{1-6}$ alkylketones, e.g. acetone and methyl isobutyl ketone, ether, such as $C_{1-6}$ dialkylether, e.g. diethylether, or diolmonoether, amides, e.g. dimethylformamide, tetrahydrofuran, dioxane, sulfoxides, sulfones, and glycol, e.g. butylglycol, and mixtures thereof. Alcohols are preferred solvents. The alcohol obtained during the hydrolysis of hydrolysable silane alkoxides may serve as a solvent.

Further details of the sol-gel process may e.g. be found in C. J. Brinker, G. W. Scherer: "Sol-Gel Science—The Physics and Chemistry of Sol-Gel-Processing", Academic Press, Boston, San Diego, New York, Sydney (1990).

Instead of the hydrolysable silane monomers already partially or completely (pre)hydrolysed species or precondensates of said monomers may be used as starting materials. The hydrolysate and/or condensate used in the present invention preferably represents an organically modified inorganic polycondensate due to the non-hydrolysable organic substituents of the silanes used. The condensation degree and viscosity depend from the properties desired and can be controlled by the skilled person. Usually a rather complete condensation degree in respect to silicon will be obtained in the final cured product. The epoxy groups contained in the hydrolysate and/or condensate of the composite composition are normally yet essentially unreacted and serve for polymerising or crosslinking during the following curing step.

For the preparation of the hydrolysate and/or condensate also other hydrolysable metal or semimetal compounds may be used in minor amounts. These hydrolysable compounds may be selected from at least one metal or semimetal M from main groups III to V, especially III and IV and/or transition groups II to V of the periodic table of the elements, and preferably comprise hydrolysable compounds of Si, Al, B, Sn, Ti, Zr, V or Zn, especially those of Si, Al, Ti or Zr, or mixtures of two or more of these elements. These compounds normally satisfy the formula $MX_n$ wherein X is as defined in formula (I), typically alkoxy, and n equals the valence of the metal or semimetal M (usually 3 or 4). One or more substituents X may be substituted by a chelate ligand. Also, hydrolysable compounds of metals of main groups I and II of the periodic table (e.g., Na, K, Ca and Mg), from transition groups VI to VIII of the periodic table (e.g., Mn, Cr, Fe, and Ni), and of the lanthanides may be used. These other hydrolysable compounds are generally used in low amounts, e.g. up to 30 mol-% in respect to the hydrolysate and/or condensate or in catalytic amounts as mentioned above, if at all.

The order of hydrolysing and/or condensing the hydrolysable silanes mentioned having non-hydrolysable groups and optionally other hydrolysable metal or semimetal compounds is not specifically limited. For example, the hydrolysable compounds may be hydrolysed and condensed together. Alternatively, one or more hydrolysable compounds may be hydrolysed or condensed separately from the other components at least in part and then mixed with the other components.

The degree of condensation reaction can be defined by the ratio of the number of condensed functional groups to the number of condensable functional groups. In practice, it can be estimated by Si-NMR measurement, and for example, in the case of a trifunctional silane compound, the degree of condensation can be calculated by the following equation using the ratio among the components shown below:

T0: a Si atom that is not bonded to another silane molecule;
T1: a Si atom that is bonded to one silane molecule through siloxane bond;
T2: a Si atom which is bonded to two silane molecules through siloxane bond; and
T3: a Si atom that is bonded to three silane molecules through siloxane bond;

$$\text{degree of condensation (\%)} = ((T1+2 \times T2+3 \times T3) \times 100)/(3 \times (T0+T1+T2+T3))$$

The degree of condensation varies in accordance with the types of silane compounds and synthetic conditions. When the degree of condensation is excessively low, the compatibility with a resin and the coating properties may become inferior in some cases. Hence, the degree of condensation is preferably 20% or more and more preferably 30% or more.

Patternability can be improved by control of the degree of condensation. The abundance ratio of T0 and T1 is preferably 50% or less in sum total. Furthermore, it is more preferably 30% or less. The abundance ratio of T3 is preferably 15% or more and more preferably 20% or more. The abundance ratio can be calculated by the following equation:

$$\text{abundance ratio of } TX(X=0,1,2,3) \text{ (\%)} = TX/(T0+T1+T2+T3) \times 100\%$$

The proportion of the silanes used for preparing the hydrolysate and/or condensate can vary in wide ranges. Generally, from 15 to 60 mol-%, preferably 30 to 50 mol-%, of at least one hydrolysable alkylsilane, from 30 to 80 mol-%, preferably 35 to 55 mol-%, of at least one hydrolysable arylsilane or alkylarylsilane, and from 1 to 60 mol-%, preferably 5 to 35 mol-%, of at least one hydrolysable silane containing an epoxy group, based on the total amount of hydrolysable compounds, are used for the hydrolysate and/or condensate. Of course, if already condensed species such as dimers or oligomers are used as starting compounds, the proportion is to be calculated in respect to the monomeric hydrolysable or hydrolysed compounds from which they are derived. As mentioned above, optionally other hydrolysable metal or semi metal compounds may be added in minor amounts, e.g. up to 30 mol-%.

The composite composition further comprises at least one organic compound having at least 2 epoxy groups. The organic compound having at least 2 epoxy groups includes monomers, oligomers (such as dimers, trimers, etc.) or polymers or mixtures thereof. Such organic compounds having at least 2 epoxy groups are known to those skilled in the art. Such compounds are cationically polymerizable. Generally cationic polymerisation is accelerated by thermal treatment. That is, the polymerisation reaction depends on the diffusion of activated species (protons).

It is preferred that the cationically polymerizable organic compound is solid at room temperature (20° C.). Thus, unnecessary diffusion during the patternwise exposure process can be prevented and a high-resolution patterning can be obtained. The melting point of the compound is preferably 40° C. or higher for producing high-resolution pattering. Preferably, the compound is an epoxy resin.

Preferably, said organic compound has an epoxide equivalent of 2,000 or less and more preferably an epoxide equivalent of 1,000 or less. When the epoxide equivalent is 2,000 or less, the cross-linking density obtained after curing is increased so that a too low Tg or heat distortion temperature of the cured product can be avoided and adhesion properties to a substrate and resistance to chemical attack are improved.

Examples of said epoxy compounds are epoxy resins having at least one or at least 2 of the structural units (1) or (2):

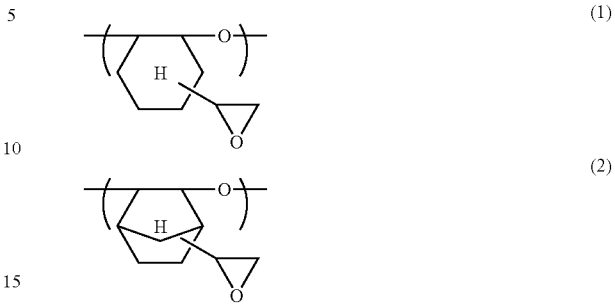

Furthermore, a novolac type epoxy resin having a bisphenol structure as shown below is also preferably used.

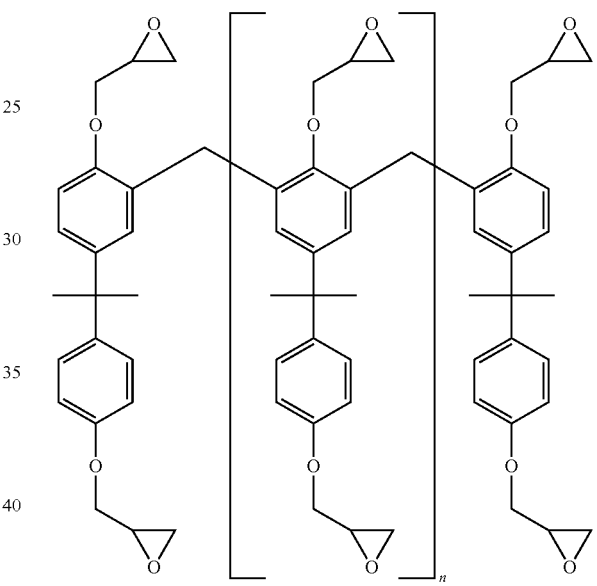

In this formula, n indicates 1, 2 or 3. Especially it is preferable in the case of n=2.

Further examples are epoxy resins of the bisphenol type (e.g. bisphenol A diglycidylether (Araldite® GY 266 (Ciba)), bisphenol F diglycidylether), epoxy resins of the novolak type, such as phenol novolak (e.g. poly[(phenyl-2,3-epoxypropylether)-ω-formaldehyde]) and cresol novolak, and epoxy resins of the triphenylolmethane type, e.g. triphenylolmethane triglycidylether, as well as cycloaliphatic epoxy resins, e.g. 4-vinylcyclohexenediepoxide, 3,4-epoxycyclohexane carboxylic acid-(3,4-epoxycyclo-hexylmethylester (UVR 6110, UVR 6128 (Union Carbide)), tetrahydro and hexahydrophtalic acid diglycidylether, and glycidylether of polyols. Additional examples are N, N-bis-(2,3-epoxypropyl)-4-(2,3-epoxypropoxy)aniline and bis-{4-[bis-(2,3-epoxypropyl)-amino]-phenyl} methane.

The mixing ratio by weight of said hydrolysate and/or condensate and said organic epoxy compound in the composite composition is preferably about 1:10 to 4:1. The hydrolysate and/or condensate refer to the hydrolysate and/or condensate as such, i.e. without solvent.

The amount of silane hydrolysate and/or condensate may vary within wide ranges. The composite composition preferably comprises 9 to 79.99% by weight, more preferably 25 to 69.99% by weight, and particularly preferably 30 to 64.99% by weight, of hydrolysate and/or condensate (a) and 20 to 90.99% by weight, more preferably 30 to 74.99% by weight, and particularly preferably 35 to 69.99% by weight of the organic compound having at least 2 epoxy groups (b), based on the total solid content of the composite composition.

The composite composition according to the present invention further contains a cationic initiator. Cationic initiators are commercially available and known in the art. The specific type of the cationic initiator used may e.g. depend on the type of cationically polymerizable groups present, the mode of initiation (thermal or photolytic), the temperature, the type of radiation (in the case of photolytic initiation) etc.

Suitable initiators include all common initiator/initiating systems, including cationic photoinitiators, cationic thermal initiators, and combinations thereof. Cationic photo-initiators are preferred. Representative of cationic initiators that can be used include onium salts, such as sulfonium, iodonium, carbonium, oxonium, silicenium, dioxolenium, aryldiazonium, selenonium, ferrocenium and immonium salts, borate salts, e.g. $[BF_3OH]H$ (obtainable from $BF_3$ and traces of water) and corresponding salts of Lewis acids such as $AlCl_3$, $TiCl_4$, $SnCl_4$, compounds containing an imide structure or a triazene structure, Meerwein complexes, e.g. $[(C_2H_5)_3O]BF_4$, perchloric acid, azo compounds and peroxides. Suitable cationic thermal initiators are 1-methylimidazole, $(C_6H_5)_3C^+[SbCl_6]^-$, $(C_6H_5)_3C^+[SbF_6]^-$, $(C_6H_5)_3C^+[ClO_4]^-$, $(C_7H_7)^+[SbCl_6]^-$, $(C_7H_7)^+[ClO_4]^-$, $(C_2H_5)_4N^+[SbCl_6]^-$, $(C_2H_5)_3O^+[BF_4]^-$ and $(C_2H_5)_3S^+[BF_4]^-$. As cationic photoinitiators aromatic sulfonium salts or aromatic iodonium salts are advantageous in view of sensitivity and stability. Cationic photoinitiators are commercially available, examples being the photo-initiators Degacure® KI 85 (bis[4-(diphenylsulfonio)phenyl]sulfide-bis-hexafluor-phosphate), Cyracure® UVI-6974/UVI-6990, Rhodorsile 2074 (tolylcumyliodonium-tetrakis(pentafluorophenylborate)), Silicolease UV200 Cata® (diphenyliodonium-tetrakis(pentafluorophenylborate)) and SP170® (4,4'-bis[di(β-hydroxyethoxy)phenyl-sulfonio]phenylsulfide-bis-hexafluoroantimonate).

The cationic initiators are employed in the usual amounts, preferably from 0.01-10% by weight, especially 0.1-5% by weight, based on the total solid content of the composite composition.

The components may be combined in any conventional manner and order. The hydrolysate and/or condensate may also be prepared in situ in the presence of the cationically polymerizable epoxy compound.

The composite composition may comprise further conventional additives in accordance with the purpose and desired properties. Specific examples are thixotropic agents, cross-linking agents, solvents, UV absorbers, lubricants, levelling agents, wetting agents, adhesion promoters, and surfactants. The solvent content may be adjusted in order to achieve suitable properties such as viscosity for the application intended. Examples for solvents are e.g. the solvents mentioned above. Also other solvents may be used such as hydrocarbons, halogenated hydrocarbons, and aromatics.

For the preparation of a patterned layer as a coating or as a moulded piece, the composite composition of the present invention can be applied to a substrate or placed in a mould.

For preparing a substrate having a patterned coating or layer, the composite coating composition according to the present invention may be applied to any desired substrate. Examples thereof are metal, glass, ceramic, crystalline and plastic substrates, but also paper, building materials, such as (natural) stones, and concrete, and textiles. Examples of metal substrates include copper, aluminium, iron, including steel, and zinc as well as metal alloys, such as brass. Examples of plastic substrates are polycarbonate, polyamide, polymethyl methacrylate, polyacrylates, and polyethylene terephthalate. Glass or ceramic substrates may be e.g. mainly based on $SiO_2$, $TiO_2$, $ZrO_2$, $PbO$, $B_2O_3$, $Al_2O_3$, and/or $P_2O_5$. Examples of crystalline substrates are silicon, quartz, lithium niobate and precious stones. A particularly preferred substrate is silicon. The substrate may be present in any form, such as, e.g., a plate, a sheet, a wafer or a film. Of course, surface-treated substrates are also suitable, e.g., substrates having sand-blasted, coated or metalized surfaces, e.g. galvanized iron plates. In a particular embodiment, the substrate is coated with at least one base layer.

The composite composition may be applied to the substrate by any conventional means. In this context, all common wet-chemical coating methods may be used. Representatives methods are e.g. spin coating, dip coating, spray coating, web coating, bar coating, brush coating, flow coating, doctor blade coating and roll coating and printing methods, such as pat printing, silk screen printing, flexo printing and pad printing. A further suitable method is direct coating.

For preparing a moulded piece with a pattern, the composite composition of the invention is placed in a mould and used as moulding material. Any conventional moulding methods can be used, for example casting and film casting. The mould or the parts for contact with the composite composition are antiadhesive. Suitable materials therefore are PTFE, antiadhesive glass, metal such as Ni or materials to which release agents are applied.

Following application, the coating may be dried, if necessary. This may be effected by allowing to stand at room temperature (about 20° C.), optionally supported by ventilation. The optional drying step B) preferably involves a heat treatment, for example at a temperature in the range of from 40 to 130° C., more preferably from 70 to 110° C., and particularly from 80 to 100° C. A particular preferred drying temperature is about 90° C. Of course, the drying time depends on the type of composite composition and the temperature used. In general, a drying time of 1 to 5 min, preferably 2 to 4 min, particularly about 3 min, may be sufficient, for example by using a heat treatment at about 90° C.

The coating composition applied to the substrate or placed in the mould is cured (hardened) in at least 2 or 3 steps. The curing step includes a cationic polymerisation of said organic compound and also of the epoxy groups in the hydrolysate and/or condensate, usually in the condensation product of the silanes. In the curing step, the condensation degree of the inorganic polycondensate may be enhanced. Further, the cationically polymerizable organic compound will generally polymerize which may include cross-linking, thereby forming the desired inorganic-organic hybrid material.

In step C the formed layer is patternwise irradiated. Any conventional method can be used, for example a photolithographic method or a two-wave-mixing method. The appropriate irradiation depends e.g. on the type of materials and the cationic initiator used. Typically, the radiation used may comprise a wavelength within the range of 360 to 420 nm. For example, UV radiation, radiation in the visible region (VIS), especially blue light, or laser light may be employed.

During the step of exposure to light or radiation (photocuring) and also during thermal curing, the cationic initiator may generate an acid. Besides the polymerisation of the cationically polymerizable compound and the epoxy groups of the condensation product, this acid may also assist in curing the siloxane framework (inorganic condensation).

By the patternwise irradiation, the curing by cross-linking and condensation reactions, of course, mainly proceeds in the areas exposed to light or radiation, in which the curing degree is enhanced.

The following heat treatment of the layer (step D), also called post-exposure baking, is important for the formation of the organic network. Usually, the temperature used for this post-exposure baking should be higher than the glass transition temperature of the layer treated. The heat treatment may be carried out, for example at a temperature in the range of from 40 to 130° C., preferably from 70 to 110° C., and more preferably from 80 to 100° C. A particular preferred curing temperature is about 90° C. Of course, the curing time depends on the type of composite composition and the temperature used. In general, a curing time of 1 to 10 min, preferably 2 to 4 min, particularly about 3 min, may be sufficient, for example by using a heat treatment at about 90° C.

After the post-exposure baking, the layer is submitted to a developing step E), wherein the layer is treated with a solvent. The treatment may be achieved e.g. by dipping the layer into the solvent or rinsing or rubbing the layer with the solvent. Any suitable solvent known in the art can be used. All solvent mentioned above can be used. Preferred solvents are polar organic solvents such as ketones, ethers or alcohols. Also water or aqueous solutions may be appropriate. In the developing step, the solvent dissolves the areas of the layer which had not be exposed to radiation during step C), whereas the areas exposed to radiation during step C) are not dissolved. Normally, the unexposed areas are dissolved until the substrate or mould surface is reached, i.e. the unexposed areas will be completely dissolved. In order to increase the developing rate, the solvent may be stirred or heated. The appropriate solvent can be easily selected by the skilled person. Surprisingly, solvents of lower dissolving power than e.g. ketones such as e.g. alcohols can be used in the process of the present invention.

Optionally, the patterned layer may finally be submitted to a final curing (step F), wherein the curing is essentially completed or nearly completed. Thereby, the mechanical and chemical resistance can be improved. The final curing step may be effected by irradiating the entire patterned layer or preferably by heating the layer. For photocuring, the methods and devices described for step C) can also be used, provided that no patternwise irradiation is necessary. If the final curing is carried out by the preferred heat treatment, e.g. temperatures in the range of 140 to 220° C. are appropriate. The temperature is preferably in the range of 160 to 220° C. and more preferably in the range of 180 to 220° C. Particularly preferred is a temperature of about 200° C.

In the case of preparing a moulded article, the patterned layer is detached from the mould. This may be done, e.g., during or after developing step E) or after final curing step F). The final moulded article may be in the form of a sheet, a film, a plate or any other shape and comprise a pattern. For convenience, such moulded articles are also referred to as layer in the description.

The thickness of the final patterned layer may vary within wide ranges, usually in the range of 5 to 80 µm, preferably in the range of 10 to 50 µm, and especially around 20 µm for substrates coated with the patterned layer, and in the range of 0.5 mm to 0.5 cm, for example about 1 mm, for patterned moulded articles.

Thus, the composite composition can advantageously be used for pattern-forming methods for both coatings and moulded articles. By using the composite coating composition of the present invention in such a pattern-forming method, it is possible to obtain a pattern which includes portions having an aspect ratio $H/W \geqq 1$ (H: pattern height, W: pattern width), preferably an aspect ratio $H/W \geqq 3$. It is also possible to form micropatterns which comprise portions having a pattern width of 100 micrometer or less.

It was unexpected that by using the composite composition of the present invention micropatterned layers could be formed showing no residual stresses after being coated on a substrate such as silicon wafers or placed in a mould. This could be shown by measuring the bending curvature of a coated silicon substrate after curing. No bending was observed.

The coatings or the moulded articles of the invention are especially useful, if the coating or the moulded article are to be contacted with alkaline solutions, but it is also useful in combination with neutral and/or acid solutions.

The composite composition of the present invention is especially suitable for coating surfaces of metals, crystalline substrates such as silicon, plastics, modified or unmodified natural substances, ceramic, concrete, clay, glass, ceramic or glass ceramics. The metal surfaces also include surfaces of metal compounds. Examples which may be mentioned are the metals copper, silver, gold, platinum, palladium, iron, nickel, chromium, zinc, tin, lead, aluminium and titanium, and alloys containing these metals, for example (stainless) steel, brass and bronze.

The above coating composition can also be applied to surfaces of oxides, carbides, silicides, nitrides, borides, etc. of metals and non-metals, for example surfaces which comprise or consist of metal oxides, carbides such as silicon carbide, tungsten carbide and boron carbide, silicon nitride, silicon dioxide, etc.

Among the surfaces of (modified or unmodified) natural substances mention may be made in particular of those of natural stone (e.g. sandstone, marble, granite), (fired) clay and cellulose materials, while it is of course also possible to coat surfaces of concrete, ceramic, porcelain, gypsum, glass and paper (including synthetic paper) in an advantageous manner using the above coating compositions. The term "glass" here includes all types of glass with a very wide variety of compositions, examples being soda lime glass, potash glass, borosilicate glass, lead glass, barium glass, phosphate glass, optical glass, and historical glass.

Among the plastics which form surfaces which can be coated with the above coating compositions are thermoplastics, thermosets, elastomers and foamed plastics. Especially preferred are thermally stable plastics. Specific examples of plastics include: homo- and copolymers of olefinically unsaturated compounds, for example olefins such as ethylene, propylene, butenes, pentenes, hexenes, octenes and decenes; dienes such as butadiene, chloroprene, isoprene, hexadiene, ethylidene norbornene and dicyclopentadiene; aromatic vinyl compounds, for example styrene and its derivatives (e.g. α-methylstyrene, chlorostyrenes, bromostyrenes, methylstyrenes); halogenated vinyl compounds, for example vinyl chloride, vinyl fluoride, vinylidene chloride, vinylidene fluoride and tetrafluoroethylene; a,β-unsaturated carbonyl compounds, for example acrylic acid, methacrylic acid, crotonic acid, maleic acid and fumaric acid and their derivatives (especially (alkyl) esters, amides, anhydrides, imides, nitriles and salts, for example ethyl acrylate, methyl methacrylate, acrylonitrile, methacrylonitrile, (meth)acrylamide and maleic anhydride); and vinyl acetate.

Further examples are polyesters such as, for example, polyethylene terephthalate and polybutylene terephthalate; polyamides such as nylons; polyimides; polyurethanes; polyethers; polysulphones; polyacetals; epoxy resins; polycarbonates; polyphenylene sulphides; (vulcanized or non-vulcanized)

synthetic rubbers; (vulcanized) natural rubber; phenol-formaldehyde resins; phenol-urea resins; phenol-melamine resins; alkyd resins; and polysiloxanes.

Plastics of this kind may of course contain the customary plastics additives, for example fillers, pigments, dyes, reinforcing agents (e.g. (glass) fibres), stabilizers, flame proofing agents, inhibitors, and lubricants.

The composite compositions of the invention are particularly suitable for coatings of and moulded piece for instruments, accessories and devices for medical purposes and sick persons such as prostheses (especially for limbs), implants, catheters, anal prostheses, dental braces, false teeth. The composite composition may be also suitable for a moulded piece which is part of the articles mentioned or which is the article as such.

In addition to the above articles it is also possible, of course, to coat other articles and parts thereof, advantageously, with the above coating compositions, or prepare such articles or components of such articles in form of a moulded piece of the composite composition, examples being jewellery, coins, works of art (for example paintings), book covers, gravestones, urns, signs (for example traffic signs), neon signs, traffic light pillars, and CDs. It is possible to give photosensitivity to the liquid-repellent layer and it is possible to form optical gratings or other optical structures.

The following examples illustrates the invention without limiting it.

EXAMPLE 1

For preparing a composite composition, 19.2 g of phenyltriethoxysilane (0.08 mol) were mixed with 8.6 g of 0.01 M hydrochloric acid as a catalyst and reacted for 1 h under reflux and stirring. 17.9 g of hexyltriethoxysilane (Hexyl-TES, 0.07 mol) were subsequently added thereto and the resulting mixture was stirred for a further 1 h under reflux. After cooling down to 50° C., 2.2 g of glycidyloxypropyltriethoxysilane (GPTES, 0.008 mol) were added and stirring was continued for 24 h at 50° C. After cooling to ambient temperature 5.4 g of organic epoxy resin EHPE-3150 (product of Daicel Chemical; epoxy resin having structural units (1) mentioned above, melting point 70° C.) were added to the silane solution and the resulting mixture was stirred at ambient temperature until EHPE-3150 was dissolved. Subsequently a cationic photoinitiator SP-170 or SP-172 was added thereto in a catalytic amount. The resulting coating solution was stirred at ambient temperature for about 1 h. It was also possible to dissolve EHPE-3150 in ethanol before mixing with the silane solution and no further stirring was necessary, but after addition of photoinitiator the coating solution was stirred at ambient temperature for about 16 h. The coating solution may be filtered by a glass-fibre filter of a pore-diameter of approx. 5 μm before application.

The composite composition obtained was applied to silicon wafers using the spin coating method (500 rpm for 10 to 30 s), followed by pre-baking at 90° C. for 3 minutes, structuring by exposing to UV light (325-380 nm) for 20 s using a special mask and post exposure baking at 90° C. for 4 min. Thereafter, the unexposed parts were washed out by immersion in 4-methyl-2-pentanone (MIBK) for 1 min and rinsing with isopropyl alcohol. In order to thoroughly cure the coating resin, heating treatment was performed, at first at a temperature of 100° C. for 1 h followed by a treatment at 200° C. for 1 h.

EXAMPLES 2 TO 8

Hydrolysable condensates shown in Table 1 were synthesized in a similar way to Example 1. As described above, the cured coating material was obtained by performing application, exposure and heating.

TABLE 1

|  | hydrolysable silane 1 | hydrolysable silane 2 | hydrolysable silane 3 | ratio/mol % |
|---|---|---|---|---|
| Example 1 | GPTES | HexyITES | PhTES | 5/45/50 |
| Example 2 | GPTES | HexyITES | PhTES | 15/35/50 |
| Example 3 | ECETES | HexyITES | PhTES | 5/45/50 |
| Example 4 | GPMDES | HexyITES | PhTES | 5/45/50 |
| Example 5 | GPTES | DMDEOS | PhTES | 5/45/50 |
| Example 6 | GPTES | HexyITES | DPhDES | 5/45/50 |
| Example 7 | GPTES | DMDEOS | PhTES | 20/40/40 |
| Example 8 | GPTES | DMDEOS | PhTES | 50/10/40 |

In the above table,
GPTES: 3-glycidoxypropyltriethoxysilane
HexyITES: hexyltriethoxysilane
PhTES: phenyltriethoxysilane
ECETES: 2-(3,4-epoxycyclohexyl)ethyltriethoxysilane
GPMDES: 3-glycidoxypropylmethyldiethoxysilane
DMDEOS: dimethyldiethoxysilane
DPhDES: diphenyldiethoxysilane

COMPARATIVE EXAMPLE 1

For comparative Example 1, a coating film was prepared in the same manner as described above using the same material as in Example 1 except the hydrolysable condensate. A cured coating material was obtained.

RESULTS

Stress of the coating materials of Examples 1 to 8 and Comparative Example 1 was measured using a thin film-property measurement device (FLX-2320, KLA-Tencor). The coating thickness was 20 μm.

The resolution properties of each composition were evaluated using a line & space mask as evaluation pattern. Abundance ratios of T0, T1 and T3 were measured by 29Si-NMR. These results are shown in Table 2. It was confirmed that the stress of the cured coating material was decreased and superior resolution properties are obtained for the compositions of the present invention.

TABLE 2

|  | stress/MPa | patternability/μm | T0 + T1/% | T3/% |
|---|---|---|---|---|
| Example 1 | 13 | 8 | 19 | 28 |
| Example 2 | 14 | 8 | 17 | 28 |
| Example 3 | 14 | 8 | 26 | 27 |
| Example 4 | 12 | 10 | 30 | 20 |
| Example 5 | 14 | 8 | 42 | 22 |
| Example 6 | 12 | 12 | 50 | 15 |
| Example 7 | 16 | 8 | 35 | 24 |
| Example 8 | 14 | 8 | 23 | 26 |
| Comparative Example 1 | 31 | 8 | — | — |

The invention claimed is:
1. A photopatternable composite composition, comprising:
   a sol-gel product comprising an alcohol solvent and a) a hydrolysate and/or condensate of a hydrolysable composition comprising:
      a1) at least one hydrolysable alkylsilane having at least one alkyl group, a2) at least one hydrolysable arylsilane having at least one aryl group or at least one hydrolysable alkylarylsilane having at least one alkylaryl group, selected from compounds represented by general formula (II)

$$R_aSiX_{(4-a)} \qquad (II)$$

wherein R, which may be the same or different, is a non-hydrolysable substituent selected from alkyl, aryl, and alkylaryl, at least one of which is an aryl or alkylaryl group, X is a hydrolysable substituent, and a is an integer from 1 to 3, and a3) at least one hydrolysable silane containing an epoxy group selected from compounds represented by general formula (III)

$$RcSi(R)_bX_{(3-b)} \qquad (III)$$

wherein Rc is a non-hydrolysable substituent having an epoxy group, R is a non-hydrolysable substituent, X is a hydrolysable substituent, and b is an integer of from 0 to 2, wherein the hydrolysable composition comprises from 15 to 60 mol-% of a1), from 30 to 80 mol-% of a2), and from 1 to 60 mol-% of a3), based on the total amount of hydrolysable compounds present in the hydrolysable composition;

b) at least one cationically polymerizable organic compound having at least 2 epoxy groups; and c) a cationic photoinitiator;

wherein said hydrolysate and/or condensate features a sum of abundance ratios T0 and T1 totaling less than 50% and an abundance ratio T3 of more than 15%, wherein T0: a Si atom that is not bonded to another silane molecule, T1: a Si atom that is bonded to one silane molecule through siloxane bond, T2: a Si atom which is bonded to two silane molecules through siloxane bond, T3: a Si atom that is bonded to three silane molecules through siloxane bond, and the abundance ratio of TX (%)=TX/(T0+T1+T2+T3)×100%, wherein X=0, 1, 2 or 3; and wherein the photopatternable composite composition comprises 9 to 79.99% by weight of a) and 20 to 90.99% by weight of b), based on total solids content of the composite composition.

2. The composite composition according to claim 1, wherein at least one alkyl group of a1) contains at least 3 carbon atoms.

3. The composite composition according to claim 1 wherein a1) is selected from compounds represented by general formula (I)

$$R_aSiX_{(4-a)} \qquad (I)$$

wherein R, which may be the same or different, is an alkyl substituent, X is a hydrolysable substituent, and a is an integer from 1 to 3.

4. The composite composition according to claim 1 wherein the hydrolysable composition comprises at least one hydrolysable silane having 3 hydrolysable substituents.

5. The composite composition according to claim 1 wherein a1) comprises an alkyltrialkoxysilane, a2) comprises an aryltrialkoxysilane, and/or a3) comprises a glycidyloxyalkyltrialkoxysilane.

6. The composite composition according to claim 1 wherein b) is selected from a monomeric compound having at least 2 epoxy groups, an oligomeric compound having at least two epoxy groups or a polymeric compound having at least two epoxy groups.

7. The composite composition according to claim 1 wherein b) is in solid state at room temperature.

8. The composite composition according to claim 1 wherein b) is selected from compounds comprising a structural unit represented by the following general formula:

wherein n indicates an integer.

9. The composite composition according to claim 1 wherein b) is selected from compounds represented by the following general formula:

wherein n indicates an integer.

10. The composite composition according to claim 1 wherein the hydrolysable composition further comprises hydrolysable metal or hydrolysable semimetal compounds.

11. The composite composition according to claim 1 wherein the alcohol solvent comprises alcohol generated during hydrolysis of the hydrolysable composition.

12. The composite composition according to claim 1 wherein the hydrolysable composition comprises from 5 to 35 mol-% of a3), based on the total amount of hydrolysable compounds present in the hydrolysable composition.

13. A substrate coated with a cured product of the composite composition according to claim 1.

14. A moulded article comprising a cured product of the composite composition according to claim 1.

15. A process of preparing a patterned layer as a coating or as a moulded article, the process comprising the following steps:

A) forming a layer by applying the composite composition according to claim 1 to a substrate or by placing said composite composition in a mould, C) patternwise irradiating the layer for partial curing, D) subjecting the layer to a heat treatment for further curing, and E) developing the layer by treating it with a solvent.

16. The process according to claim 15 further comprising at least one of the following steps:

B) drying the layer formed in step A) before step C), and

F) irradiating or heating the patterned layer for final curing after step E).

17. The process according to claim 16 wherein step B) is carried out by a heat treatment.

18. The process according to claim 16 wherein step D) is carried out at a temperature of 40 to 130° C.

19. The process according to claim 16 wherein step F) is carried out at a temperature of 140 to 220° C. or by irradiating the patterned layer, as a whole.

20. The process according to claim 16 further comprising detaching the patterned layer from the mould during or after step E) or after step F).

21. The process according to claim 15 wherein ultraviolet light, blue light or laser light is used for step C).

22. The process according to claim 15 wherein an organic polar solvent is used for step E).

23. The process according to claim 15 wherein the substrate is optionally pre-treated or pre-coated and is selected from the group consisting of crystalline substrates, silicon, metal, glass, ceramic, glass-ceramic and polymer substrates.

24. The process according to claim 15 wherein step C) is carried out using a photolithographic method or a two-wave-mixing method.

25. The process according to claim 15 wherein step A) is carried out by placing said composite composition in a mould by casting or film casting.

26. A coated substrate prepared by the process according to claim 15.

27. The coated substrate according to claim 26, wherein the pattern comprises portions with a pattern width of 100 micrometer or less.

28. A moulded article prepared by the process according to claim 15.

29. The moulded article according to claim 28, wherein the pattern comprises portions with a pattern width of 100 micrometer or less.

* * * * *